US008105937B2

(12) United States Patent
Cheng et al.

(10) Patent No.: US 8,105,937 B2
(45) Date of Patent: Jan. 31, 2012

(54) CONFORMAL ADHESION PROMOTER LINER FOR METAL INTERCONNECTS

(75) Inventors: Tien-Jen Cheng, Bedford, NY (US); Zhengwen Li, Fishkill, NY (US); Keith Kwong Hon Wong, Wappingers Falls, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 635 days.

(21) Appl. No.: 12/190,906

(22) Filed: Aug. 13, 2008

(65) Prior Publication Data

US 2010/0038789 A1 Feb. 18, 2010

(51) Int. Cl.
*H01L 21/44* (2006.01)

(52) U.S. Cl. ........ 438/629; 438/652; 438/653; 438/654; 438/687; 257/E21.584

(58) Field of Classification Search .................. 438/629, 438/652–654, 687; 257/E21.584
See application file for complete search history.

(56) References Cited

U.S. PATENT DOCUMENTS

| | | | |
|---|---|---|---|
| 6,171,949 B1 | 1/2001 | You et al. | |
| 6,365,927 B1 | 4/2002 | Cuchiaro et al. | |
| 6,787,480 B2 | 9/2004 | Aoki et al. | |
| 6,849,535 B2 | 2/2005 | Noguchi et al. | |
| 7,094,705 B2 | 8/2006 | Lin et al. | |
| 7,268,087 B2 | 9/2007 | Aoki et al. | |
| 7,289,183 B2 | 10/2007 | Gan et al. | |
| 7,294,217 B2 | 11/2007 | Beatson et al. | |
| 7,749,906 B2* | 7/2010 | Dominguez et al. | 438/687 |
| 2003/0137050 A1 | 7/2003 | Chambers et al. | |
| 2004/0038522 A1 | 2/2004 | Ahn | |
| 2004/0142184 A1 | 7/2004 | Behle et al. | |
| 2006/0138661 A1 | 6/2006 | Hu | |
| 2006/0141155 A1 | 6/2006 | Gordon et al. | |
| 2007/0054489 A1 | 3/2007 | Wong et al. | |
| 2008/0102628 A1 | 5/2008 | Hasunuma et al. | |
| 2008/0254232 A1* | 10/2008 | Gordon et al. | 427/585 |

FOREIGN PATENT DOCUMENTS

WO    WO2007142700 A1    12/2007

OTHER PUBLICATIONS von Richthofen, Alexander, et al.—"Cu-N. Films Grown by Reactive MSIP: Constitution, Structure and Morphology"—Mikrochim Acta 125—pp. 173-177—(1997).

(Continued)

*Primary Examiner* — Kenneth Parker
*Assistant Examiner* — Jose R Diaz
(74) *Attorney, Agent, or Firm* — Scully, Scott, Murphy & Presser, P.C.; Katherine S. Brown, Esq.

(57) ABSTRACT

A dielectric layer is patterned with at least one line trough and/or at least one via cavity. A metallic nitride liner is formed on the surfaces of the patterned dielectric layer. A metal liner is formed on the surface of the metallic nitride liner. A conformal copper nitride layer is formed directly on the metal liner by atomic layer deposition (ALD) or chemical vapor deposition (CVD). A Cu seed layer is formed directly on the conformal copper nitride layer. The at least one line trough and/or the at least one via cavity are filled with an electroplated material. The direct contact between the conformal copper nitride layer and the Cu seed layer provides enhanced adhesion strength. The conformal copper nitride layer may be annealed to covert an exposed outer portion into a contiguous Cu layer, which may be employed to reduce the thickness of the Cu seed layer.

9 Claims, 8 Drawing Sheets

OTHER PUBLICATIONS

Int'l Application No. PCT/US2009/53256 Applicant's Reference No. FIS920080182 Date Filed: Aug. 10, 2009 Applicant: Tien-Jen Cheng, et al. Title: Conformal Adhesion Promoter Liner for Metal Interconnects.

* cited by examiner

CONFORMAL ADHESION PROMOTER LINER FOR METAL INTERCONNECTS

FIELD OF THE INVENTION

The present invention relates to a semiconductor structure, and particularly to a back-end-of-line (BEOL) metal interconnect structure comprising a metallic conformal adhesion promoter liner, and methods of manufacturing the same.

BACKGROUND OF THE INVENTION

Metallic liners are employed in back-end-of-line (BEOL) metal interconnect structures to provide adhesion strength between a metal fill structure and a dielectric layer which embeds the metal fill structure. The metallic liner and the metal fill structure collectively constitute a current-carrying structure, which may be, for example, a metal line, a metal via, or an integrally formed combination thereof. For reliable operation of the current-carrying structure, high adhesion strength between the metallic liner and the metal fill structure is necessary. The high adhesion strength between the metallic liner and the metal fill structure provides protection against electromigration as well as mechanical stability of the BEOL metal interconnect structures.

In most cases, an anneal is needed to increase the grain size of the material of the metal fill structure formed directly on the metallic liner. When the adhesion strength is not sufficient, voids may be formed at the interface between the metallic liner and the metal fill structure upon annealing of the current-carrying structure. Such voids increase the resistance of the current-carrying structure, degrading electrical performance.

Further, surface diffusion along the boundary between the metallic liner and the metal fill structure is often the dominant factor in determining overall electromigration performance of the current-carrying structure. Thus, the adhesion strength between the metallic liner and the metal fill structure is critical in determining electromigration resistance of the current-carrying structure. Any void at the interface between the metallic liner and the metal fill structure exacerbates deterioration of electromigration performance by providing an initial void that grows with progression of electromigration with usage of the current carrying structure, i.e., passing of electrical current therethrough.

Referring to FIG. 1, a prior art metal interconnect structure comprises a patterned dielectric layer 110, a metallic nitride liner 120, a metal liner 130, a Cu seed layer 150, and an electroplated Cu structure 160. The patterned dielectric layer 110 comprises a line trough and a via cavity located underneath the line trough. The metallic nitride liner 120, the metal liner 130, the Cu seed layer 150, and the electroplated Cu structure 160 fill the line trough and the via cavity to form a prior art current-carrying structure (120, 130, 150, 160), which is an integrally formed line and via structure.

The metallic nitride liner 120 is typically formed by physical vapor deposition (PVD). Since PVD is a directional deposition method in which the deposited material moves from the direction of the sputtering target toward a substrate on which deposition occurs, the step coverage of the metallic nitride liner 120 is always less than 1.0, i.e., less material is deposited on sidewalls of a structure than on planar surfaces. Thus, more material is deposited on a bottom surface of the line trench than on sidewalls of the via cavity. One way to increase the side-wall coverage is a combination of deposition and directional sputter etching. In this case, a metallic material deposited on a recessed bottom surface may be resputtered off the bottom surface and redeposited onto the sidewalls surrounding the recessed bottom surface by a directional sputter etching. Further, more material is deposited on an upper portion of the sidewalls of the via cavity than a lower portion of the via cavity. While chemical vapor deposition (CVD) and atomic layer deposition (ALD) methods are known to provide enhanced step coverage than PVD, impurities are often found in these films, which will degrade the quality of the film as an adhesion layer and a diffusion barrier layer.

The metal liner 130 is also typically formed by PVD. The metal liner 130 is non-conformal due to the directional nature of the deposition process as discussed above. The accumulation of more material in the upper portion of the via cavity than in the lower portion of the via cavity creates an overhang at the top of the via cavity that blocks deposition of material at the bottom of the via cavity. Such an overhang makes subsequent filling of the via cavity with a conductive material difficult since the materials will seal off the top portion, which prevent further deposition inside of the via. Further, the metallic nitride liner 120 and the metal liner 130 have higher resistivity than the electroplated Cu structure 160. For this reason, the thickness of the metallic nitride liner 120 and the thickness of the metal liner 130 need to be kept as small as possible. Particularly, the scaling of semiconductor devices in front-end-of-line (FEOL) requires that metal interconnect structure be correspondingly scaled down.

Scaling down of the thicknesses of the metallic nitride liner 120 and the metal liner 130 may create a reliability problem. Specifically, when the planar thickness of the metallic nitride liner 120 and the metal liner 130 is about 10 nm or less, the coverage on the sidewall may not be uniform or contiguous. Thus, a thin metal liner region 133 may be formed, especially at a bottom portion of a sidewall of a via cavity, at which the thickness of the metal liner 130 is thinner than neighboring areas. In some cases, the material of the metal liner 130 may be absent in the thin metal liner region 133.

As the Cu seed layer 150 is deposited directly on the metal liner 130 by PVD, the thin metal liner region 133 provides less adhesion between the Cu seed layer 150 and the metal liner 130. This is because Cu tends to have weak adhesion to the metallic nitride liner 120 in the absence of a metal liner 130, or through a thin portion of the metal liner 130, within the thin metal liner region 133. The via cavity and the line trough are filled with electroplated Cu structure 160 to form the prior art current-carrying structure (120, 130, 150, 160).

Referring to FIG. 2, the thin metal liner region 133 of FIG. 1 is prone to formation of a cavity 137 due to the weak adhesion of the Cu seed layer 150 to a thinner portion of the metal liner 130 and to the metallic nitride liner 120. In one case, the cavity 137 may be formed during an anneal that is typically performed after the electroplating of the electroplated Cu structure 160 to increase the grain size of the electroplated Cu material. The weak adhesion between the Cu seed layer 150 and the metal liner at the thin metal liner region 133 facilitates movement of Cu material, which induces formation of the cavity.

Even if formation of a cavity is avoided during the anneal, usage of the prior art current-carrying structure (120, 130, 150, 160) by passing current therethrough may induce formation of a cavity 137 by electromigration of Cu material. The thin metal liner region 133 is vulnerable to electromigration and formation of the void 137 because of the weaker adhesion of the Cu material.

In view of the above, there exists a need to provide a metal interconnect structure providing sufficient adhesion strength between a metal fill structure and a patterned dielectric layer without requiring an excessive thickness.

Particularly, there exists a need for a metal interconnect structure including a metallic liner structure which provides sufficient adhesion strength over the entirety of the surface of the metallic liner structure without generating a region of weak adhesion strength.

SUMMARY OF THE INVENTION

The present invention provides a back-end-of-line (BEOL) metal interconnect structure comprising a metallic conformal adhesion promoter liner which conformally covers an underlying metallic liner to provide sufficiently high and uniform adhesion strength over the entirety of the surface of the underlying metallic liner, and methods of manufacturing the same.

In the present invention, a dielectric layer is patterned with at least one line trough and/or at least one via cavity. A metallic nitride liner is formed on the surfaces of the patterned dielectric layer. A metal liner is formed on the surface of the metallic nitride liner. A conformal copper nitride layer is formed directly on the metal liner by atomic layer deposition (ALD) or chemical vapor deposition (CVD). The conformal copper nitride layer is conformal due to the nature of the process employed to form the conformal copper nitride layer. A Cu seed layer is formed directly on the conformal copper nitride layer. The at least one line trough and/or the at least one via cavity are filled with an electroplated material. The direct contact between the conformal copper nitride layer and the Cu seed layer provides enhanced adhesion strength. The conformal copper nitride layer may be annealed to covert an exposed outer portion into a contiguous Cu layer, which may be employed to reduce the thickness of the Cu seed layer.

According to an aspect of the present invention, a method of forming a semiconductor structure is provided, which comprises:

forming a patterned dielectric layer on a substrate;

forming a metallic nitride liner directly on patterned surfaces of the patterned dielectric layer;

forming a metal liner comprising an elemental metal or an intermetallic alloy directly on the metallic nitride liner; and forming a conformal adhesion promoter liner comprising copper nitride directly on the metal liner by chemical vapor deposition (CVD) or atomic layer deposition (ALD).

In one embodiment, the method further comprises forming a Cu seed layer directly on the conformal adhesion promoter liner.

In another embodiment, the method further comprises electroplating Cu material directly on the Cu seed layer.

In even another embodiment, the method further comprises planarizing the electroplated Cu material, wherein a surface of the metallic nitride liner, a surface of the metal liner, a surface of the conformal adhesion promoter liner, and a surface of the electroplated Cu material are substantially horizontal and coplanar.

In yet another embodiment, the copper nitride has a composition of $Cu_xN$, wherein x is from about 1 to about 5.

In still another embodiment, the method further comprises annealing the conformal adhesion promoter liner at an elevated temperature from about 150° C. to about 400° C., wherein an exposed outer portion of the conformal adhesion promoter liner is converted to a conformal Cu-rich conductive layer.

In a further embodiment, the method further comprises annealing the electroplated Cu material and the Cu seed layer, wherein the electroplated Cu material and the Cu seed layer structurally merge to form a conductive Cu structure of integral construction that is free of interfacial surfaces within the volume thereof.

In yet further embodiment, the method further comprises annealing the electroplated Cu material, the Cu seed layer, and the conformal Cu-rich conductive layer, wherein the electroplated Cu material, the Cu seed layer, and the conformal Cu-rich conductive layer structurally merge to form a conductive Cu structure of integral construction that is free of interfacial surfaces within the volume thereof.

According to another aspect of the present invention, a metal interconnect structure is provided, which comprises:

a patterned dielectric layer located on a substrate and including at least one of a line trough and a via cavity;

a metallic nitride liner abutting a patterned surface of the patterned dielectric layer;

a metal liner comprising an elemental metal or an intermetallic alloy and abutting the metallic nitride liner; and a conformal adhesion promoter liner comprising copper nitride and abutting the metal liner.

In one embodiment, the metal interconnect structure further comprises a Cu seed layer abutting the conformal adhesion promoter liner.

In another embodiment, the metal interconnect structure further comprises an electroplated conductive structure, wherein the metallic nitride liner, the metal liner, the conformal adhesion promoter liner, the Cu seed layer, and the electroplated conductive structure completely fill the line trough or the via cavity.

In even another embodiment, the electroplated conductive structure consists of Cu and impurities, wherein the impurities may comprise O, N, C, Cl, and S, and wherein a total concentration of impurities is from about 1 ppm to about 200 ppm.

In yet another embodiment, the metal interconnect structure further comprises a conformal Cu-rich conductive layer abutting on the conformal adhesion promoter liner.

In still another embodiment, the metal interconnect structure further comprises:

a Cu seed layer abutting the conformal Cu-rich conductive layer; and an electroplated conductive structure, wherein the metallic nitride liner, the metal liner, the conformal adhesion promoter liner, the conformal Cu-rich conductive layer, the Cu seed layer, and the electroplated conductive structure completely fill the line trough or the via cavity.

In a further embodiment, the metal interconnect structure further comprises a conductive Cu structure of integral construction that is free of interfacial surfaces within the entirety of the volume thereof and abutting said conformal adhesion promotion liner.

DETAILED DESCRIPTION OF THE INVENTION

Figure 1:
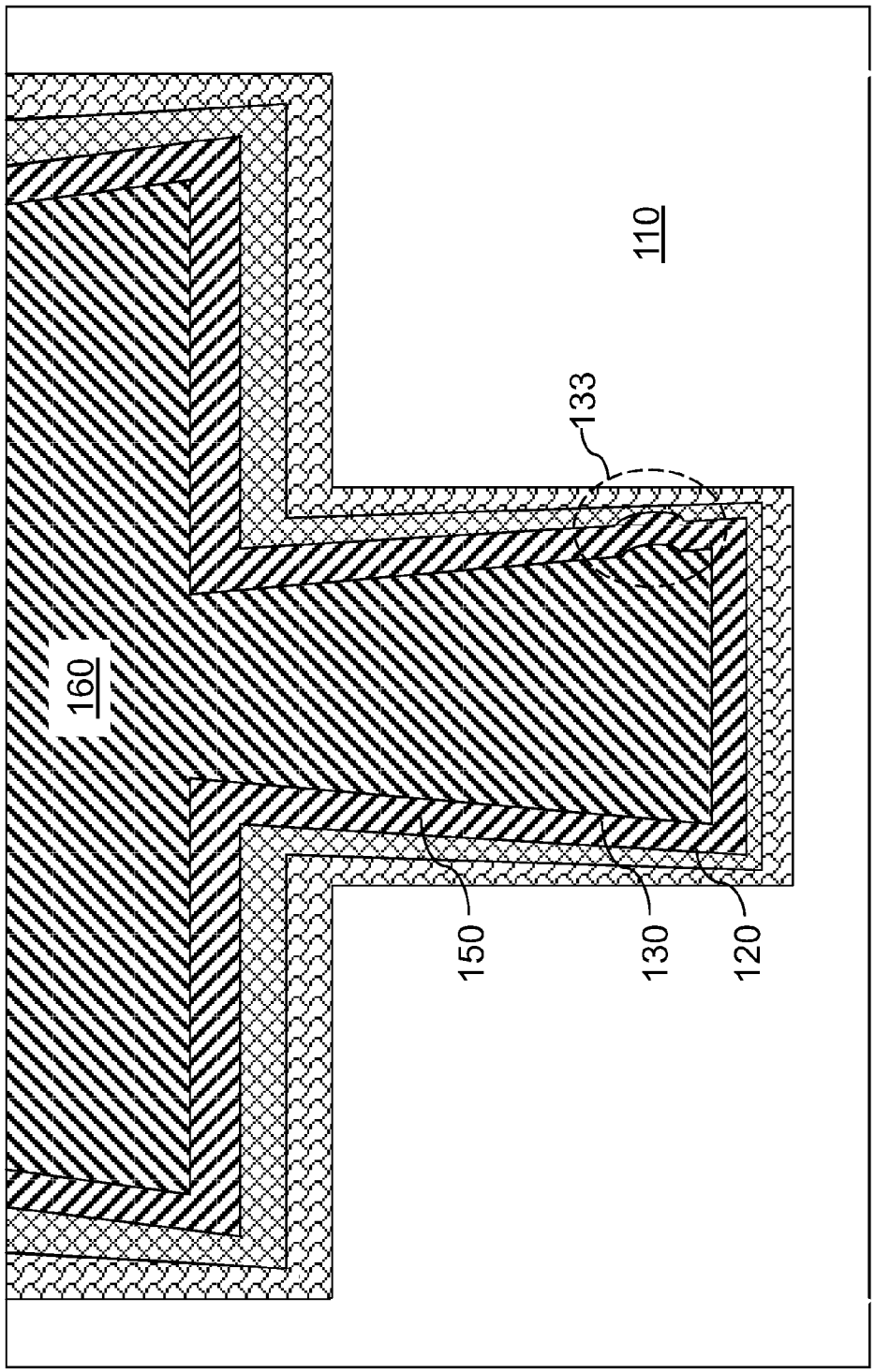
FIG. 1 is a vertical cross-sectional view of an exemplary prior art metal interconnect structure after formation of a current-carrying structure embedded in a patterned dielectric layer.
Figure 2:
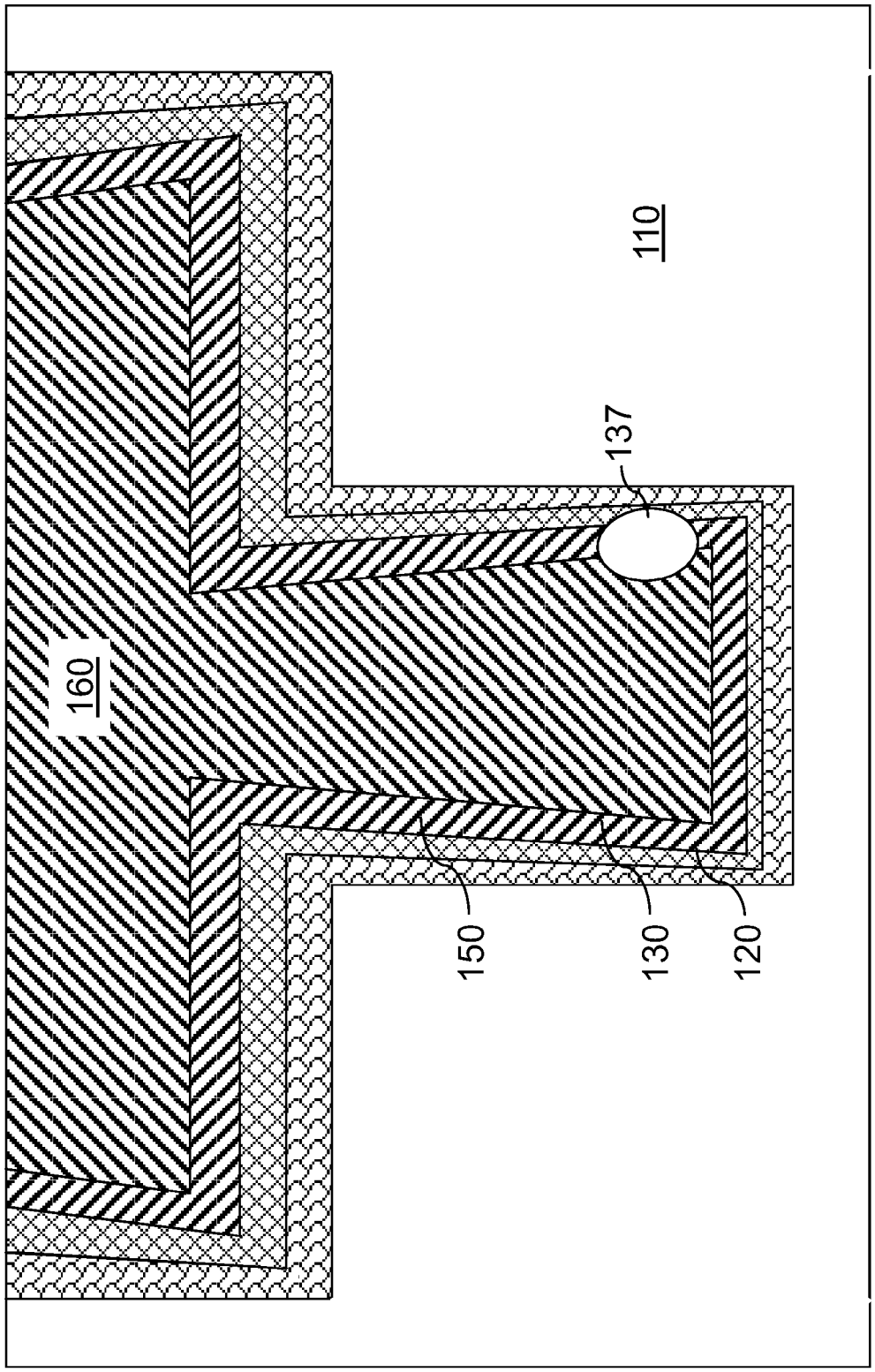
FIG. 2 is a vertical cross-sectional view of the exemplary prior art metal interconnect structure after anneal or after usage, in which a cavity 137 is formed.

As stated above, the present invention relates to a back-end-of-line (BEOL) metal interconnect structure comprising a metallic conformal adhesion promoter liner, and methods of manufacturing the same, which are described herein with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Figure 3:
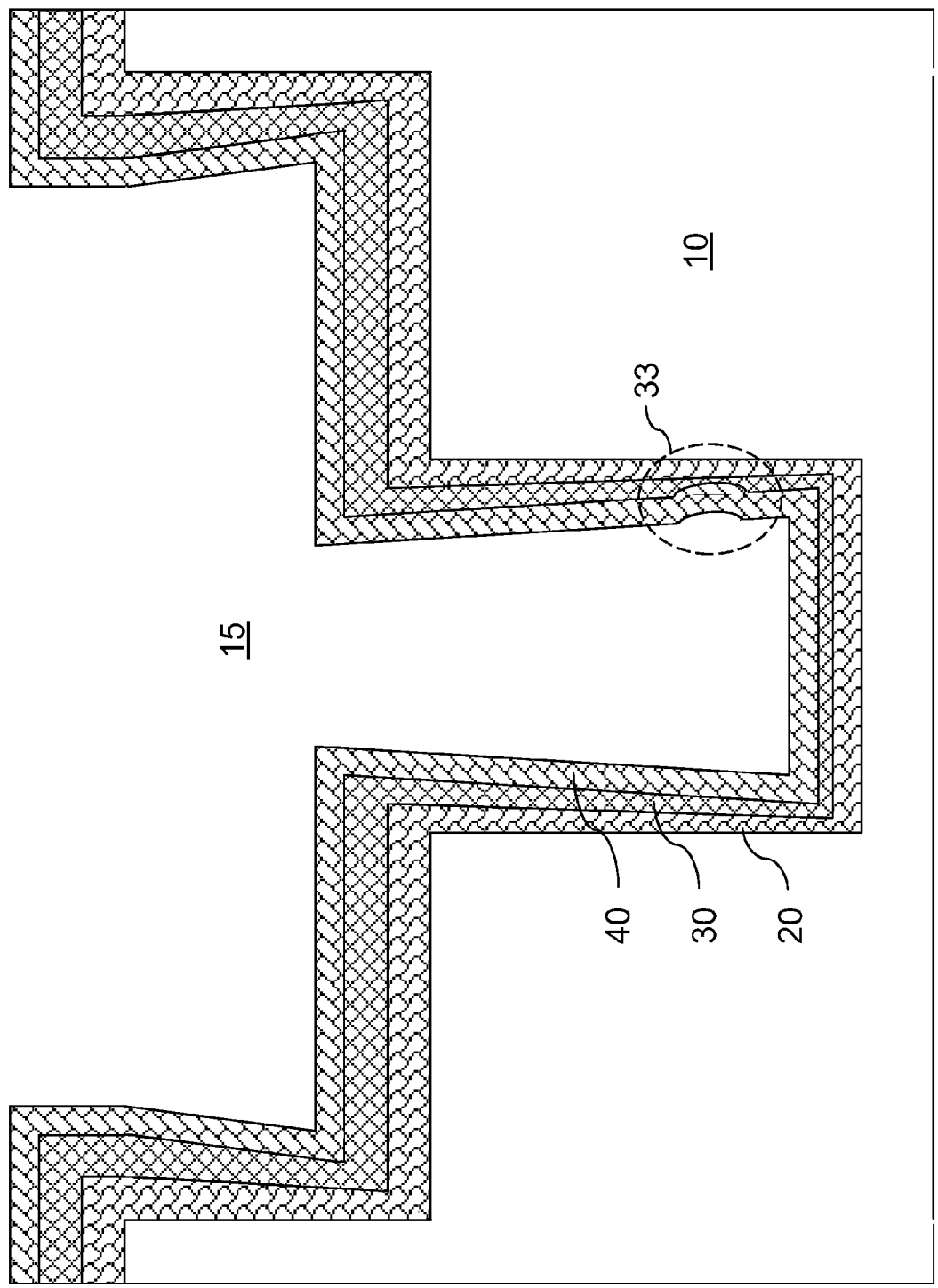
FIG. 3 is a vertical cross-sectional view of a first exemplary metal interconnect structure after formation of a conformal adhesion promoter liner 40.

Referring to FIG. 3, a first exemplary metal interconnect structure according to a first embodiment of the present invention comprises a patterned dielectric layer 10 and a conductive metallic liner stack formed directly on the top and sidewall surfaces of the patterned dielectric layer 10. The conductive metallic liner stack comprises, from bottom to top, a metallic nitride liner 20, a metal liner 30, and a conformal adhesion promoter liner 40.

The patterned dielectric layer 10 has a pattern of at least one cavity 15, which may be at least one line trough, at least one via cavity, or a combination thereof in which the at least one via cavity underlies the at least one line trough. For the purposes of description of the present invention, at least one via cavity 15 which is a dual damascene cavity including a via cavity and an overlying line trough is employed. The present invention may be employed to other metal interconnect structures in general, including a patterned dielectric layer including at least one via cavity and not including a line trough, a patterned dielectric layer including at lest one line trough and not including a via cavity, and a patterned dielectric layer including a plurality of via cavities and a plurality of line cavities. Such variations are explicitly contemplated herein.

The dual damascene cavity may be formed by a set of two lithographic steps and two etch steps employing a dual damascene integration scheme that is known in the art. The via cavity may be formed prior to formation of the line cavity, or vice versa depending on the details of the dual damascene integration scheme. As noted above, the present invention is compatible with single damascene integration schemes as well as with dual damascene integration schemes. Any metal interconnect structure that forms a cavity in a patterned dielectric layer 10 may be employed to practice the present invention.

The patterned dielectric layer 10 comprise a dielectric material that is typically employed in BEOL interconnect structures. The dielectric materials that may be used for the patterned dielectric layer 10 include, but are not limited to, a silicate glass, an organosilicate glass (OSG) material, a SiCOH-based low-k material formed by chemical vapor deposition, a spin-on glass (SOG), or a spin-on low-k dielectric material such as SiLK™, etc. The silicate glass includes an undoped silicate glass (USG), borosilicate glass (BSG), phosphosilicate glass (PSG), fluorosilicate glass (FSG), borophosphosilicate glass (BPSG), etc. The dielectric material may be a low dielectric constant (low-k) material having a dielectric constant less than 3.0. The dielectric material may be non-porous or porous.

The dielectric material of the patterned dielectric layer 10 may be formed by plasma enhanced chemical vapor deposition, high density plasma chemical vapor deposition, thermal chemical vapor deposition, spin coat and cure, etc. The thickness of patterned dielectric layer 10 may be from about 100 nm to about 2,000 nm, and typically from about 200 nm to about 1,000 nm, although lesser and greater thicknesses are also contemplated herein.

The patterned dielectric layer 10 may be formed on a substrate (not shown). A typical substrate that may be employed to form the patterned dielectric layer 10 is a semiconductor substrate including at least one semiconductor device such as a field effect transistor, a bipolar transistor, a junction diode, a capacitor, a resistor, an inductor, etc. In this case, the first exemplary metal interconnect structure is incorporated within a larger metal interconnect structure (not shown) that includes multiple levels of metal wiring structures and provides electrical wiring among the semiconductor devices on the semiconductor substrate as well as between the semiconductor devices and a bonding structure such as C4 pads or wirebond pads.

A metallic nitride liner 20 is formed directly on the patterned surfaces of the patterned dielectric layer 10. The patterned surfaces include a bottom surface of a via cavity, sidewall surfaces of the via cavity, a bottom surface of the line trough, sidewall surfaces of the line trough. The metallic nitride liner 20 comprises a conductive metallic nitride, i.e., a conductive nitride of an elemental metal, an intermetallic alloy of at least two elemental metals, or an alloy of at least one elemental metal and at lest one non-metallic element such as semiconductor elements. Typically, the metallic nitride liner 20 consists of a conductive metallic nitride. For example, the metallic nitride liner 20 may comprise TaN, TiN, WN, TaSiN, TiSiN, and WSiN. The metallic nitride liner 20 may be stoichiometric or non-stoichiometric. In case the metallic nitride liner 20 is non-stoichiometric, the metallic nitride liner 20 may be nitrogen rich or nitrogen deficient as long as the metallic nitride liner 20 is conductive.

Typically, the metallic nitride liner 20 is deposited by physical vapor deposition (PVD), which is a sputtering process performed in vacuum. Particles of a metal is dislodged from a sputtering target under nitrogen atmosphere in a vacuum process chamber, and are deposited on the surface of the patterned dielectric layer 10 that is placed within the vacuum process chamber. A PVD process is directional. Thus, more material is deposited on a non-recessed or protruding horizontal surface than on a vertical surface. Also, more material is deposited on a top portion of a vertical surface than on a bottom portion of the vertical surface. The thickness of the metallic nitride liner 20 thus varies depending on the location of measurement. Including the variation within the metallic nitride liner 20, the thickness of the metallic nitride liner 20 may be from about 2 nm to about 20 nm, although lesser and greater thicknesses are also contemplated herein. In some embodiments, the metallic nitride liner 20 may be formed by chemical vapor deposition (CVD) or atomic layer deposition (ALD).

The metallic nitride liner 20 performs the function of providing a conductive surface having sufficient adhesion strength directly on the patterned dielectric layer 10. Further, the metallic nitride liner functions as a diffusion barrier so that impurity materials such as mobile atoms do not diffuse through the metallic nitride liner 20. Since the entirety of the exposed surface of the patterned dielectric layer 10 needs to be covered by the metallic nitride liner 20 and the PVD process is statistical by nature, reduction of the thickness of the metallic nitride liner 20 toward the lower end of usable thickness range, e.g., toward 2.0 nm, tend to cause insufficient coverage of the patterned dielectric layer 20, thereby degrading the adhesive performance and effectiveness as a diffusion barrier layer.

The metal liner 30 is formed directly on the surfaces of the metallic nitride liner 20. The metal nitride liner 30 is formed over the entirety of the metallic nitride liner 20. The metal liner 30 functions as an intermediate layer that provides sufficient adhesion strength between the metallic nitride liner 20 and an elemental metal that is typically employed to fill the at least one cavity 15 and to provide a primary current conduction path for electrical current. Typically, the elemental metal employed to fill the at least one cavity is Cu. The metal liner 30 comprises an elemental metal, an intermetallic alloy of at least two elemental metals. Typically, the metal liner 30 consists of an elemental metal, an intermetallic alloy of at least two elemental metals. Materials that provide high adhesion strength to both the metallic nitride liner 20 and elemental Cu include Ta, Ru, Ti, Co, W, Fe, Ni, Ir, Rh, Re, Pt, etc. and their intermetallic alloys.

The metal liner 30 may be deposited by physical vapor deposition (PVD) or chemical vapor deposition (CVD). Including the variation within the metal liner 30, the thickness of the metal liner 30 may be from about 2 nm to about 10 nm, although lesser and greater thicknesses are also contemplated herein.

As the thickness of the metal liner 30 decreases with scaling of metal interconnect structures, the film may become nonuniform or discontinuous. This induces formation of a thin metal liner region 33, which is a region of the metal liner 30 that contains a hole or a portion having a lesser thickness than surrounding regions. The thin metal liner region 33 typically occurs at a location having a low step coverage for the process such as a lower portion of the sidewalls of the via cavity that is located at the bottom of the at least one cavity 15. In the thin metal liner region 33, the metal liner 30 may be discontinuous so that a surface of the metallic nitride liner 20 is exposed.

The conformal adhesion promoter liner 40 is formed directly on the metal liner 30. The conformal adhesion promoter liner 40 is formed by atomic layer deposition (ALD) or chemical vapor deposition (CVD), which forms a conformal film having a step coverage that is greater than 90%, even for high aspect ratio geometries, i.e., geometries having a large number, e.g., greater than 3.0, for the ratio between the depth of a cavity and the width of the cavity. The conformal adhesion promoter liner 40 enhances adhesion between the metal nitride liner 20 and the conductive material, which is a Cu seed layer, to be subsequently deposited. The thickness of the conformal adhesion promoter liner 40 may be from about 0.5 nm to about 20 nm. In one case, the thickness of the conformal adhesion promoter liner 40 may be from about 0.5 nm to about 5.0 nm.

For example, the conformal adhesion promoter liner 40 comprises copper nitride. In a preferred embodiment, the conformal adhesion promoter liner 40 consists essentially of copper nitride. In case any surface of the metallic nitride liner 20 is exposed within a hole in the metal liner 30 within the thin metal liner region 33, the copper nitride of the conformal adhesion promoter liner 40 directly contacts the metallic nitride liner 20 and the Cu seed layer to be subsequently deposited. The nitrogen atoms in the copper nitride material induce high adhesion strength to the material of the metallic nitride liner 20, which also contain nitrogen. The copper atoms in the copper nitride material induce high adhesion strength to the Cu seed layer to be subsequently deposited. Further, since the conformal adhesion promoter liner 40 is conformal, all holes in the metal liner 30 are filled with the material of the conformal adhesion promoter liner 40.

For other portions of the thin metal liner region 33 which contain a thinner portion of the metal liner 30 relative to the surrounding regions, the conformal coverage of the adhesion promoter liner 40 enforces the adhesion strength provides by the metal liner 30 to the material to be subsequently deposited.

Typically, the adhesion strength between a metallic nitride liner and an elemental metal such as the Cu seed layer is less than the adhesion strength between a metal nitride liner and the elemental metal since the nitrogen atoms present in the metallic nitride liner tends to decrease the adhesion strength. For this reason, a directly contact between the Cu seed layer and the metallic nitride liner 30 is undesirable and avoided. The copper nitride material employed in the present invention, however, provides good adhesion strength to a Cu seed layer because the copper nitride material includes Cu. Further, the nitrogen atoms present in the copper nitride material provide good adhesion to the metallic nitride liner which also contains nitrogen atoms. In this regard, the copper nitride provides an exception among metallic nitride materials by providing high adhesion strength under direct contact with Cu material such as the Cu seed layer. The conformal nature of deposition, i.e., the inherent high conformality of ALD processes and CVD processes, enables a complete coverage of exposed surfaces so that any hole or thin portion of the metal liner 30 within the thin metal line region 33 is covered with the conformal adhesion promoter liner 40. The metallic nitride liner 20, the metal liner 30, and the conformal adhesion promoter liner 40 collectively constitute the conductive metal liner stack (20, 30, 40).

In case the conformal adhesion promoter liner 40 is formed by atomic layer deposition (ALD), a series of alternating exposures to copper amidinate and ammonia is employed. Chemical formulae for copper amidinates are known in the art. The ALD process is typically performed at a temperature from about 150° C. to about 300° C. The partial pressure of copper amidinate is from about 1 mTorr to about 1 Torr during each cycle of exposure to copper amidinate, although lesser and greater partial pressures are also contemplated herein. The duration of exposure to copper amidinate may be from about 0.1 second to about 300 second per exposure cycle, and is typically from about 1 second to about 30 seconds per exposure cycle. The partial pressure of ammonia is from about 10 mTorr to about 10 Torr during each cycle of exposure to ammonia. The duration of exposure to ammonia may be from about 0.1 second to about 300 second per exposure cycle, and is typically from about 1 second to about 30 seconds per exposure cycle. Typically, the process chamber for the ALD process is pumped to a base pressure between each exposure to copper amidinate and a subsequent or precedent exposure to ammonia. Optionally, the process chamber may be purged with an inert gas between each exposure to copper amidinate and a subsequent or precedent exposure to ammonia. One set of an exposure to copper amidinate and an exposure to ammonia forms one atomic layer of copper nitride.

In case the conformal adhesion promoter liner 40 is formed by chemical vapor deposition (CVD), copper amidinate and ammonia are flowed simultaneously into a process chamber. The CVD process is typically performed at a temperature from about 150° C. to about 350° C. The partial pressure of copper amidinate is from about 1 mTorr to about 10 Torr during the CVD process, although lesser and greater partial pressures are also contemplated herein. The partial pressure of ammonia is in the same order of magnitude. The growth rate of copper nitride in the CVD process may be from about 0.02 nm/min to about 10 nm/min, although lesser and greater deposition rates are also contemplated herein.

The composition of copper nitride may vary depending on the process conditions employed. The resistivity of the copper nitride also varies with the composition, i.e., the atomic ratio of copper to nitrogen, of the copper nitride. In general, the chemical composition of copper nitride is give by $Cu_xN$, in which x is from about 1 to about 5. In one embodiment, the copper nitride is substantially stoichiometric with the value of x substantially equal to 3.0. $Cu_3N$ is a stoichiometric compound of Cu and N. As indicated above, however, the nitrogen content and the resistivity of the copper nitride may be varied by adjusting process conditions during the ALD process or the CVD process, such as the deposition temperatures. The higher the deposition temperature, the higher copper amount in the copper nitride films.

Figure 4:
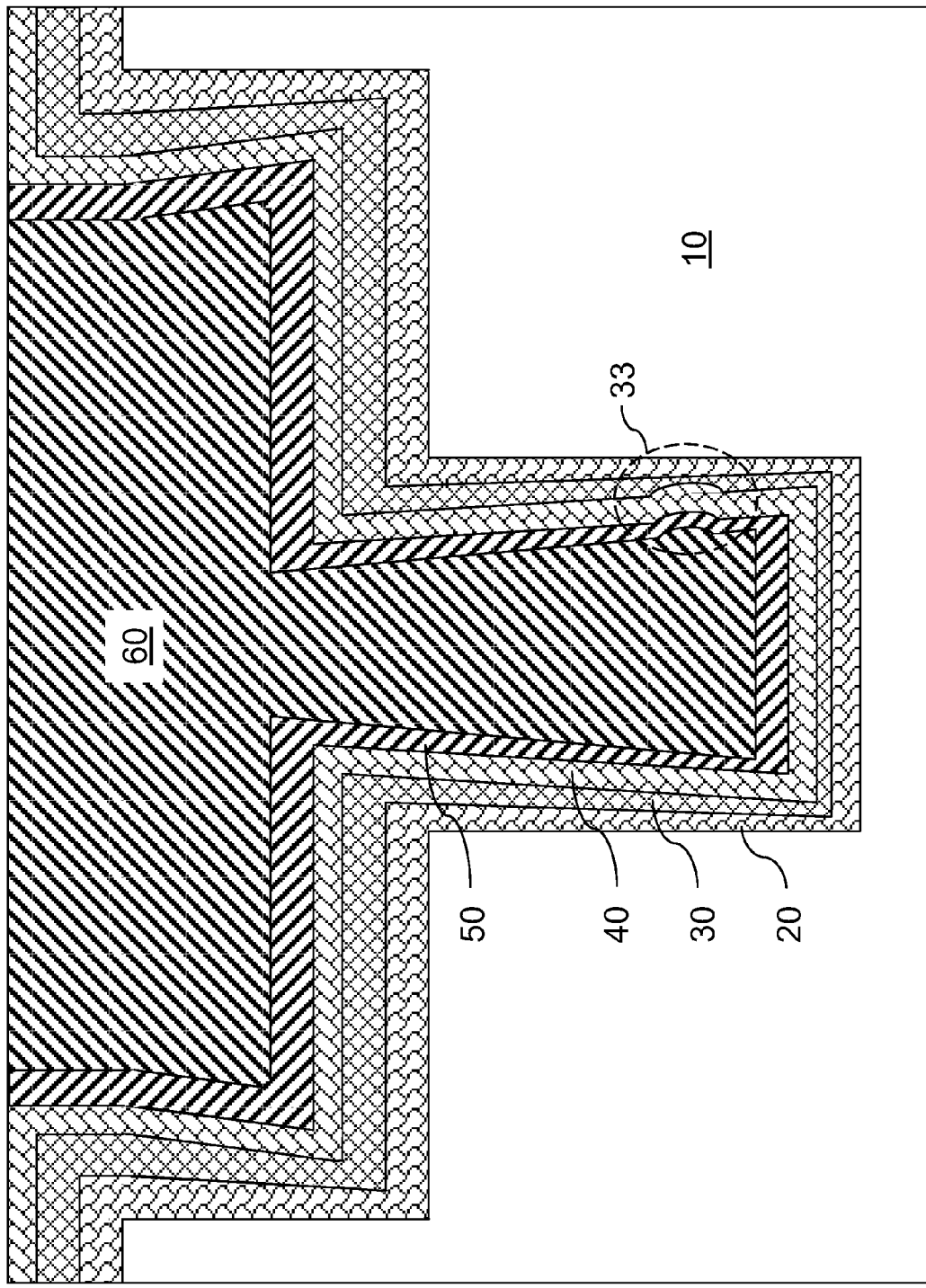
FIG. 4 is a vertical cross-sectional view of the first exemplary metal interconnect structure after formation of a Cu seed layer 50 and an electroplated Cu structure 60.

Referring to FIG. 4, a Cu seed layer 50 and an electroplated conductive structure 60 are formed in the at least one cavity 15. It is noted that the portions of the electroplated conductive structure 60, the Cu seed layer 50, the conformal Cu-rich conductive layer 45, the conformal adhesion promoter liner 40, the metal liner 30, and the metallic nitride liner 20 above the topmost surface of the conformal adhesion promoter liner 40 are not shown in FIG. 7 for clarity.

The Cu seed layer 50 is deposited directly on the surfaces of the conformal adhesion promoter liner 40, which may comprise copper nitride as discussed above. The Cu seed layer 50 comprises Cu, and preferably, consists of Cu. Typically, a Cu seed layer 50 formed by PVD provides a superior performance relative to other types of Cu seed layers. As discussed above, use of a PVD process induces variations in the thickness in the film. Thus, the Cu seed layer 50 has a thickness variation across the film. To provide sufficient seeding material at a location having a low step coverage, e.g., a bottom portion of sidewalls of a via cavity, a Cu seed material portion having a thickness exceeding the thickness of a minimum amount of Cu material for seeding is formed on non-recessed or protruding portion of horizontal surfaces. Including the thickness variations within the Cu seed layer 50, the thickness of the Cu seed layer 50 is typically from about 10 nm to about 60 nm, although lesser and greater thicknesses are also contemplated herein.

A metal is electroplated directly on the Cu seed layer 50 to completely fill the at least one cavity 15 forming the electroplated conductive structure 60. Both the via cavity and the line trough within the at least one cavity are filled with the electroplated material. Preferably, the electroplated metal comprises Cu. Methods of electroplating Cu are known in the art. In case the electroplated material comprises Cu, the electroplated material also includes impurity atoms that are introduced into the electroplated Cu material according to known electroplating methods.

Figure 5:
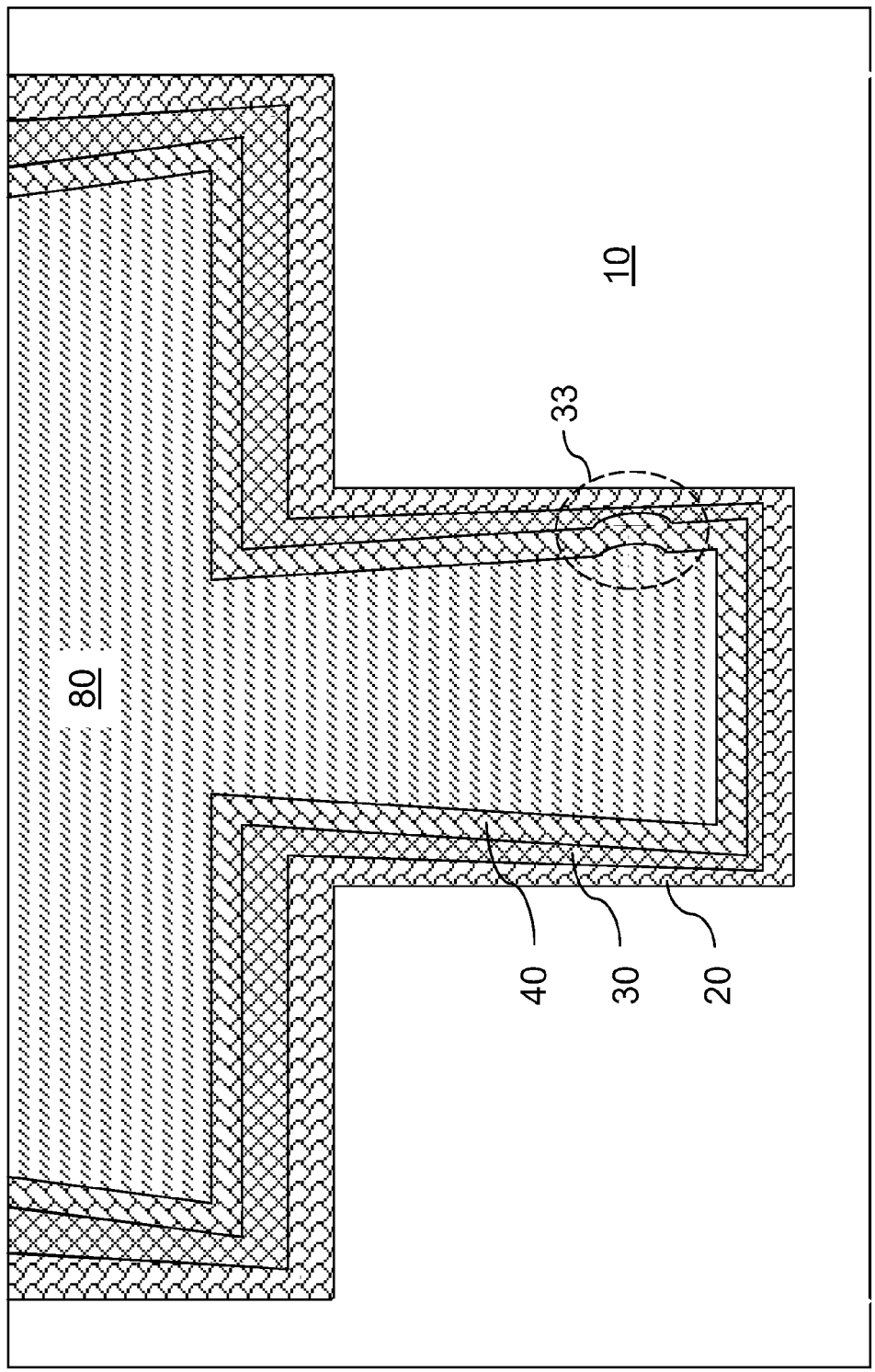
FIG. 5 is a vertical cross-sectional view of the first exemplary metal interconnect structure after formation of a conductive Cu structure 80 by annealing the Cu seed layer 50 and the electroplated Cu structure 60.

Referring to FIG. 5, in case the electroplated conductive structure 60 comprises electroplated Cu, the first exemplary metal interconnect structure may be annealed at an elevated temperature above 100° C., and typically at an elevated temperature from about 150° C. to about 400° C. to promote grain growth in the Cu seed layer 50 and the electroplated conductive structure 60. After the anneal, the electroplated conductive structure 60 and the Cu seed layer 50 structurally merge to form a conductive Cu structure 80 of integral construction that abuts the conformal adhesion promotion liner 40. Typically, the conductive Cu structure 80 of integral construction is free of interfacial surfaces within the entirety of the volume thereof due to the merging of the electroplated conductive structure 60 and the Cu seed layer 50. The interface between the adhesion promoter liner 40 and the conductive Cu structure 80 may be gradual. The conformal adhesion promotion liner 40 may be partially decomposed to copper-rich copper nitride, which forms good adhesion to structure 80.

The portions of the electroplated material, the Cu seed layer 50, the conformal adhesion promoter liner 40, the metal liner 30, and the metallic nitride liner 20 that are located above a topmost surface of the patterned dielectric layer 10 are removed by planarization. The planarization may be effected, for example, by chemical mechanical planarization (CMP). The topmost portion of the patterned dielectric layer 10 may include a dielectric hardmask layer (not shown separately), which may be employed as a stopping layer for the CMP process. At the end of planarization, the remaining portion of the electroplated material constitutes an electroplated conductive structure 60. In a preferred embodiment, the electroplated conductive structure 60 comprises electroplated Cu material, which includes impurities as discussed above.

The metallic nitride liner 20, the metal liner 30, the conformal adhesion promoter liner 40, the Cu seed layer 50, and the electroplated conductive structure 60 completely fill the at least one cavity 15 (See FIG. 3), which may be the line trough overlying the via cavity.

Figure 6:
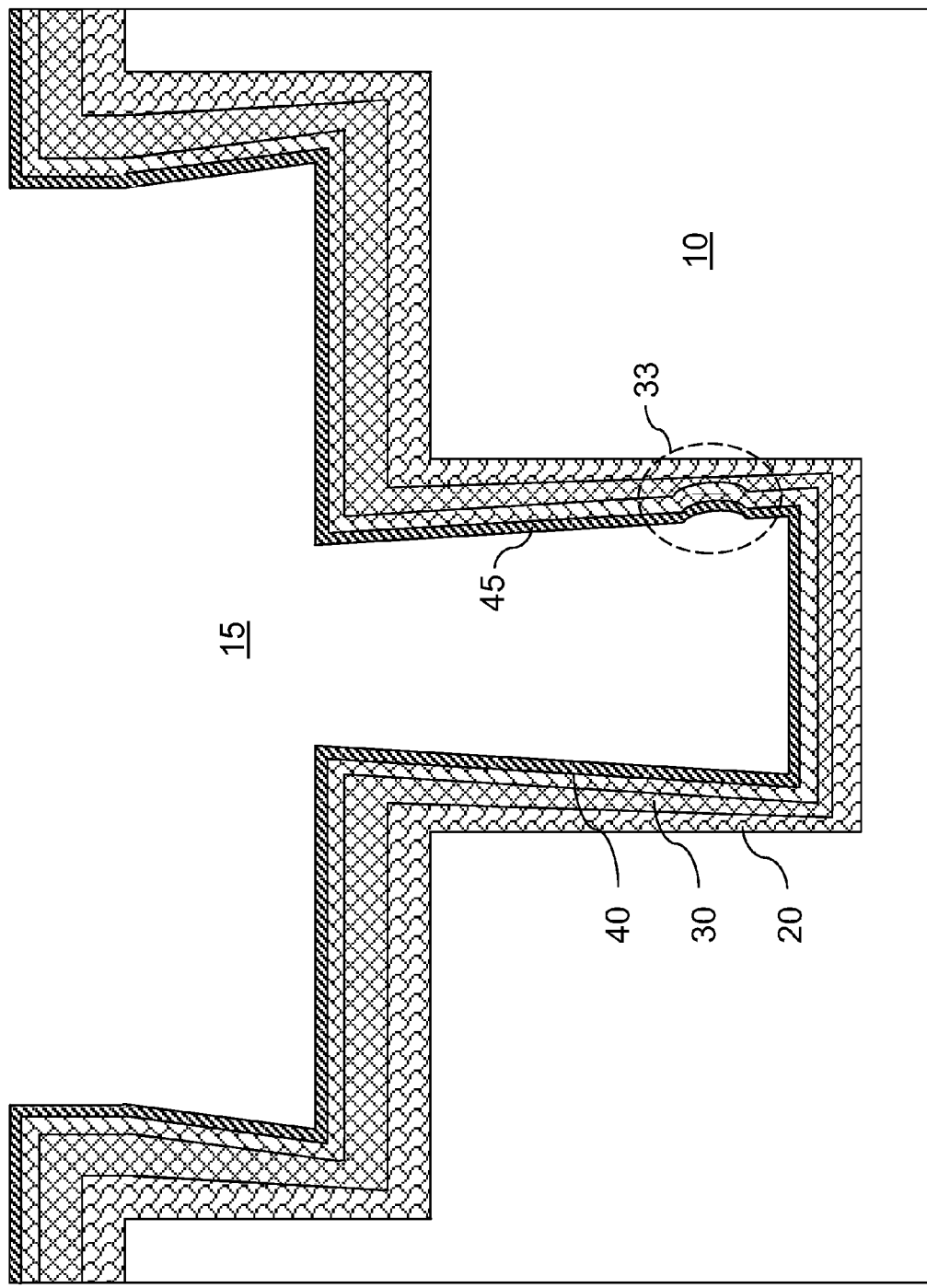
FIG. 6 is a vertical cross-sectional view of a second exemplary metal interconnect structure after an anneal that converts an exposed portion of a conformal adhesion promoter liner 40 into a conformal Cu layer 45.

Referring to FIG. 6, a second exemplary metal interconnect structure is derived from the first metal interconnect structure of FIG. 3 according to the first embodiment of the present invention. In the second embodiment, the conformal adhesion promoter liner 40 comprises, and preferably consists of, copper nitride. After formation of the first exemplary metal interconnect structure of FIG. 3, the second exemplary metal interconnect structure of FIG. 6 is derived by annealing the conformal adhesion promoter liner 40 at an elevated temperature from about 150° C. to about 400° C. The exposed outer portion of the conformal adhesion promoter liner 40 is converted to a conformal Cu-rich conductive layer 45. In one embodiment, the conformal Cu-rich conductive layer 45 includes an elemental Cu layer that is substantially devoid of atomic nitrogen and consists essentially of Cu. In another embodiment, the conformal Cu-rich conductive layer includes a copper rich copper nitride layer having a composition of $CuN_\delta$, wherein δ may be from about 0.001 to about 0.3, and typically from about 0.001 to about 0.1, and more typically from about 0.001 to about 0.02. The interface between the conformal Cu-rich conductive layer 45 and the conformal adhesion promoter liner 40 may be gradual so that the concentration of nitrogen changes gradually across the interface. Forming gas, which typically comprises about 5-10% of hydrogen gas and about 90-95% of nitrogen gas may be employed as the ambient gas during the anneal that converts the outer portion of the conformal adhesion promoter liner 40 into the conformal Cu-rich conductive layer 45.

The conformal Cu-rich conductive layer 45 is conformal because the chemical conversion of the copper nitride material into elemental Cu is a chemical reaction that proceeds at the same rate irrespective of aspect ratio. The thickness of the conformal adhesion promoter liner 40 is from about 0.5 nm to about 20 nm prior to the anneal. In the second embodiment, the thickness of the conformal adhesion promoter liner 40 is preferably from about 2 nm to about 20 nm prior to the anneal to enable conversion of a portion of the conformal adhesion promoter liner 40 into the conformal Cu-rich conductive layer 45. The thickness of the conformal Cu-rich conductive layer 45 may be from about 0.5 nm to about 20 nm, although lesser and greater thicknesses are also contemplated herein. The thickness of the conformal adhesion promoter liner 40 may be from about 0.5 nm to about 19.5 nm after the anneal, although lesser and greater thicknesses are also contemplated herein. The adhesion strength between the remaining portion of the conformal adhesion promoter liner 40 and the conformal Cu-rich conductive layer 45 is high because the two layers comprise the same element, i.e., Cu, and are derived from the original conformal adhesion promoter layer 40 prior to the anneal.

Figure 7:
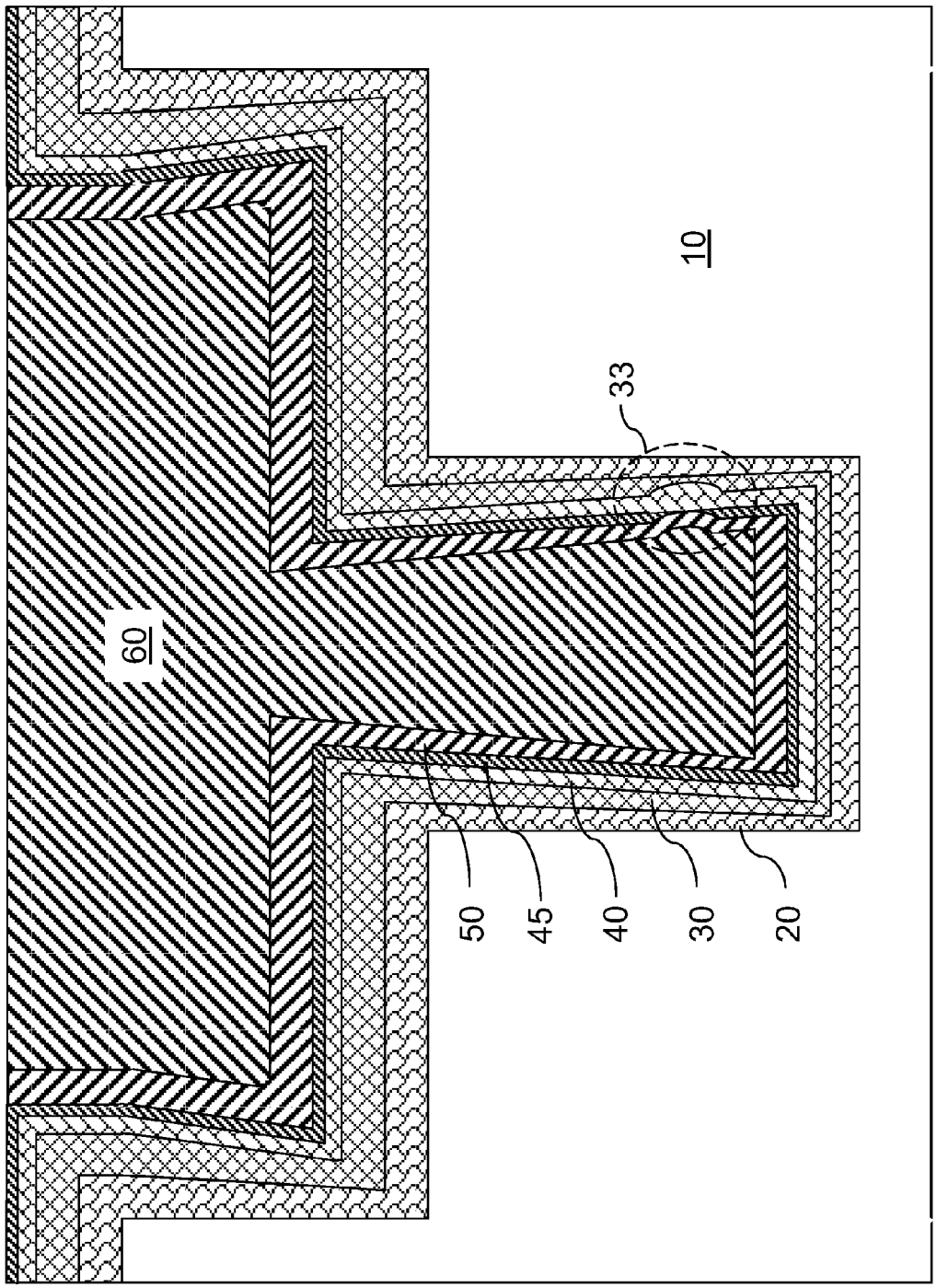
FIG. 7 is a vertical cross-sectional view of the second exemplary metal interconnect structure after formation of a Cu seed layer 50 and an electroplated Cu structure 60.

Referring to FIG. 7, a Cu seed layer 50 and an electroplated conductive structure 60 are formed in the at least one cavity 15. It is noted that the portions of the electroplated conductive structure 60, the Cu seed layer 50, the conformal Cu-rich conductive layer 45, the conformal adhesion promoter liner 40, the metal liner 30, and the metallic nitride liner 20 above the topmost surface of the conformal Cu-rich conductive layer 45 are not shown in FIG. 7 for clarity.

The Cu seed layer 50 is deposited directly on the surfaces of the conformal Cu-rich conductive layer 45. Because the Cu seed layer 50 and the conformal Cu-rich conductive layer 45 comprise Cu, the adhesion strength between the Cu seed layer 50 and the conformal Cu-rich conductive layer 45 is high. The Cu seed layer 50 may be formed by the same methods as in the first embodiment, e.g., by PVD. The Cu seed layer 50 has a thickness variation across the film if PVD is employed. Because the conformal Cu-rich conductive layer 45 provides additional Cu material, the thickness of the Cu seed layer 50 may be less than the thickness of the Cu seed layer 50 in the first embodiment, and may be from about 5 nm to about 60 nm, although lesser and greater thicknesses are also contemplated herein. According to the present invention, less material may be required for the Cu seed layer 50 because the underlying layers provide a conformal coverage of the sidewalls of a via hole. Thus, the profile of the conductive materials including the Cu seed layer 50 generates a wider opening at the upper portion of the via hole so that pinch-off during a subsequent copper electroplating process is avoided.

A metal is electroplated directly on the Cu seed layer 50 to completely fill the at least one cavity 15 (See FIG. 6) as in the first embodiment. Both the via cavity and the line trough within the at least one cavity are completely filled with the electroplated material. Preferably, the electroplated metal comprises Cu.

Figure 8:
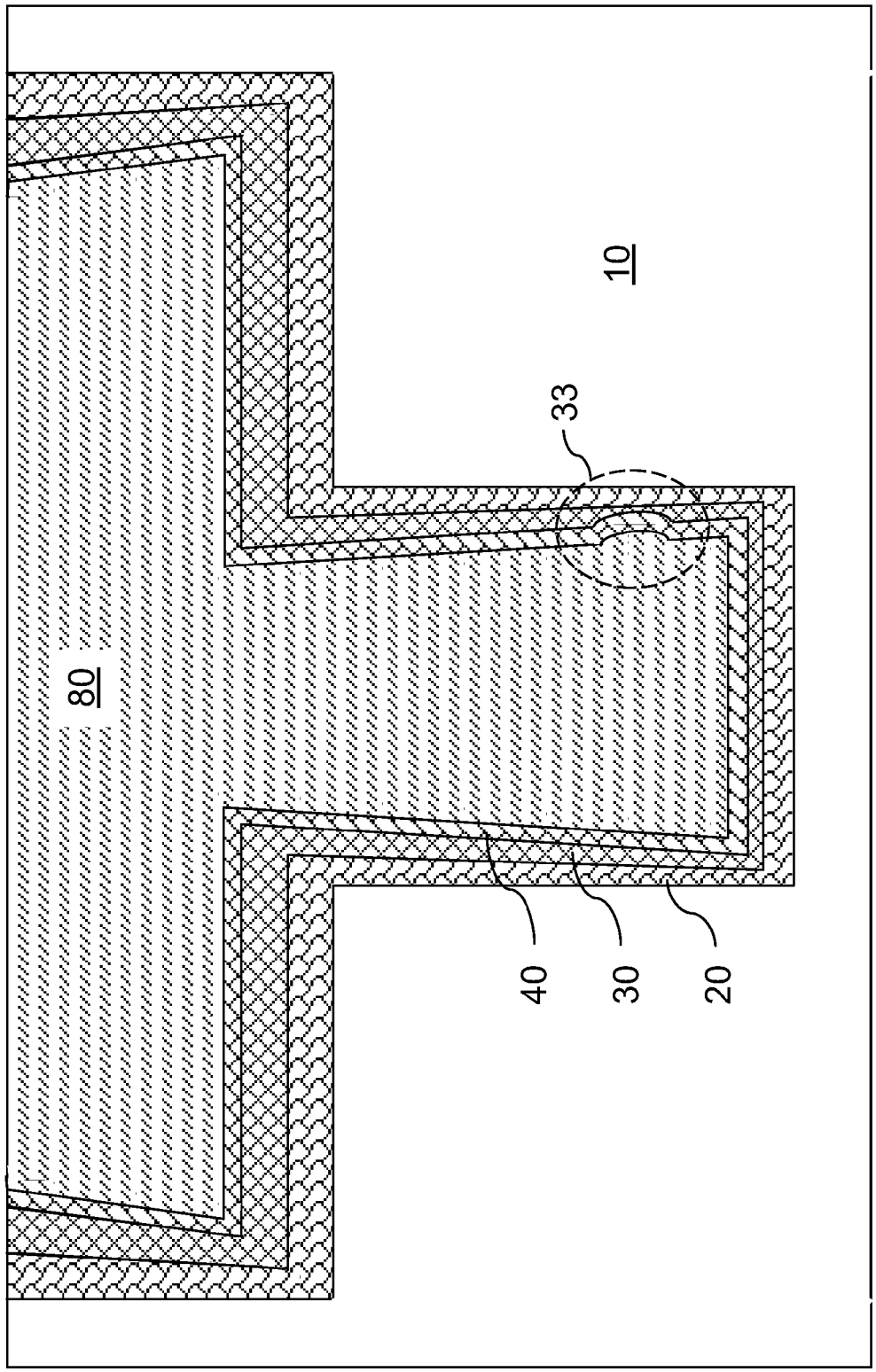
FIG. 8 is a vertical cross-sectional view of the second exemplary metal interconnect structure after formation of a conductive Cu structure 80 by annealing the conformal Cu layer 45, the Cu seed layer 50, and the electroplated Cu structure 60.

Referring to FIG. 8, in case the electroplated conductive structure 60 comprises electroplated Cu, the second exemplary metal interconnect structure may be annealed at an elevated temperature above 100° C., and typically at an elevated temperature from about 150° C. to about 400° C. to promote grain growth in the conformal Cu-rich conductive layer, the Cu seed layer 50, and the electroplated conductive structure 60. After the anneal, the electroplated conductive structure 60, the Cu seed layer 50, and the conformal elemental Cu layer portion of the conformal Cu-rich conductive layer 45 structurally merge to form a conductive Cu structure 80 of integral construction that abuts the conformal adhesion promotion liner 40. In case the the entirety of the conformal Cu-rich conductive layer 45 is converted into a conformal elemental Cu layer, the entirety of the conformal Cu-rich conductive layer 45 is incorporated into the conductive Cu structure 80. Typically, the conductive Cu structure 80 of integral construction is free of interfacial surfaces within the entirety of the volume thereof due to the merging of the electroplated conductive structure 60, the Cu seed layer 50, and the conformal Cu-rich conductive layer 45. The conductive Cu structure 80 typically consists of Cu and impurities. The impurities comprise O, N, C, Cl, and S, wherein a total concentration of impurities is from about 1 ppm to about 200 ppm.

The portions of the electroplated material, the Cu seed layer 50, the conformal Cu-rich conductive layer 45, the conformal adhesion promoter liner 40, the metal liner 30, and the metallic nitride liner 20 that are located above a topmost surface of the patterned dielectric layer 10 are removed by planarization. The planarization may be effected, for example, by chemical mechanical planarization (CMP). The topmost portion of the patterned dielectric layer 10 may include a dielectric hardmask layer (not shown separately), which may be employed as a stopping layer for the CMP process. At the end of planarization, the remaining portion of the electroplated material constitutes an electroplated conductive structure 60. In a preferred embodiment, the electroplated conductive structure comprises electroplated Cu material, which includes impurities as discussed above.

The metallic nitride liner 20, the metal liner 30, the conformal adhesion promoter liner 40, the conformal Cu-rich conductive layer 45, the Cu seed layer 50, and the electroplated conductive structure 60 completely fill the at least one cavity 15 (See FIG. 6), which may be the line trough overlying the via cavity. A surface of the metallic nitride liner 20, a surface of the metal liner 30, a surface of the conformal adhesion promoter liner 40, a surface of the conformal Cu-rich conductive layer 45, a surface of the Cu seed layer 50, and a surface of the electroplated conductive structure 60 are substantially horizontal and coplanar among one another at the top of the first exemplary metal interconnect structure. Further, the top surface of the electroplated conductive structure 60 is substantially coplanar with the topmost surface of the patterned dielectric layer 10.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
   forming a patterned dielectric layer on a substrate;
   forming a metallic nitride liner directly on patterned surfaces of said patterned dielectric layer;
   forming a metal liner comprising an elemental metal or an intermetallic alloy directly on said metallic nitride liner;
   forming a conformal adhesion promoter liner comprising copper nitride directly on said metal liner by chemical vapor deposition (CVD) or atomic layer deposition (ALD);
   converting an exposed outer portion of said conformal adhesion promoter liner to a conformal Cu-rich conductive layer including copper and nitrogen by an anneal; and
   forming a Cu seed layer by physical vapor deposition (PVD) directly on said conformal Cu-rich conductive layer, wherein said Cu-rich conductive layer is spaced from said metal liner by a remaining portion of said conformal adhesion promoter liner comprising copper nitride during formation of said Cu seed layer.

2. The method of claim 1, wherein said conformal adhesion promoter liner is formed by atomic layer deposition (ALD) by a series of alternating exposures to copper amidinate and ammonia.

3. The method of claim 2, wherein said ALD is performed at a temperature from about 150° C. to about 300° C., and wherein a partial pressure of copper amidinate is from about 1 mTorr to about 1 Ton during each cycle of exposure to copper amidinate.

4. The method of claim 1, wherein said conformal adhesion promoter liner is formed by chemical vapor deposition (CVD) employing a simultaneous flow of copper amidinate and ammonia.

5. The method of claim 4, wherein said CVD is performed at a temperature from about 150° C. to about 350° C., and wherein a partial pressure of copper amidinate is from about 1 mTorr to about 100 Torr during said CVD.

6. The method of claim 1, wherein said copper nitride has a composition of $Cu_xN$, wherein x is from about 1 to about 5.

7. The method of claim 1, wherein said anneal is performed at an elevated temperature from about 150° C. to about 400° C.

8. The method of claim 7, further comprising
electroplating Cu material directly on said Cu seed layer.

9. The method of claim 8, further comprising annealing said electroplated Cu material, said Cu seed layer, and said conformal Cu-rich conductive layer, wherein said conformal Cu-rich conductive layer includes a conformal elemental Cu layer, and wherein said electroplated Cu material, said Cu seed layer, and said conformal elemental Cu layer structurally merge to form a conductive Cu structure of integral construction that is free of interfacial surfaces within the entirety of the volume thereof.

* * * * *